US012635230B2

(12) United States Patent
Mehandru et al.

(10) Patent No.: US 12,635,230 B2
(45) Date of Patent: May 19, 2026

(54) TRANSISTOR STRUCTURES WITH REDUCED SOURCE/DRAIN LEAKAGE THROUGH BACKSIDE TREATMENT OF SUBFIN SEMICONDUCTOR MATERIAL

(71) Applicant: Intel Corporation, Santa Clara, CA (US)

(72) Inventors: Rishabh Mehandru, Portland, OR (US); Stephen Cea, Hillsboro, OR (US); Patrick Keys, Portland, OR (US); Aaron Lilak, Beaverton, OR (US); Cory Weber, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 435 days.

(21) Appl. No.: 17/485,340

(22) Filed: Sep. 25, 2021

(65) Prior Publication Data

US 2023/0097948 A1 Mar. 30, 2023

(51) Int. Cl.
H10D 30/00 (2025.01)
H10D 30/01 (2025.01)
(Continued)

(52) U.S. Cl.
CPC ......... H10D 84/834 (2025.01); H10D 30/024 (2025.01); H10D 30/6211 (2025.01);
(Continued)

(58) Field of Classification Search
CPC .............. H10D 30/019; H10D 30/024; H10D 30/6735; H10D 62/121
See application file for complete search history.

(56) References Cited

U.S. PATENT DOCUMENTS

2020/0035560 A1* 1/2020 Block ................ H10D 84/0186
2020/0219997 A1* 7/2020 Mehandru .............. H10D 30/62

FOREIGN PATENT DOCUMENTS

EP 3608965 2/2020
EP 3678171 7/2020
(Continued)

OTHER PUBLICATIONS

"Proximal." Merriam-Webster.com. 2025. https://www.merriam-webster.com/dictionary/proximal (Nov. 18, 2025). (Year: 2025).*
(Continued)

*Primary Examiner* — Reema Patel
(74) *Attorney, Agent, or Firm* — Essential Patents Group, LLP

(57) ABSTRACT

Integrated circuitry comprising transistor structures having a channel portion over a base portion of fin. The base portion of the fin is an insulative amorphous oxide, or a counter-doped crystalline material. Transistor structures, such as channel portions of a fin and source and drain materials may be first formed with epitaxial processes seeded by a front side of a crystalline substrate. Following front side processing, a backside of the transistor structures may be exposed and the base portion of the fin modified from the crystalline substrate composition into the amorphous oxide or counter-doped crystalline material using backside processes and low temperatures that avoid degradation to the channel material while reducing transistor off-state leakage.

6 Claims, 12 Drawing Sheets

(51) Int. Cl.

| | | |
|---|---|---|
| *H10D 30/62* | (2025.01) | |
| *H10D 84/01* | (2025.01) | |
| *H10D 84/03* | (2025.01) | |
| *H10D 84/83* | (2025.01) | |
| *H10P 14/60* | (2026.01) | |

(52) U.S. Cl.
CPC ....... *H10D 84/013* (2025.01); *H10D 84/0158* (2025.01); *H10D 84/038* (2025.01); *H10P 14/6349* (2026.01)

(56)                     References Cited

FOREIGN PATENT DOCUMENTS

| | | |
|---|---|---|
| EP | 3678191 | 7/2020 |
| WO | 2017003411 | 1/2017 |
| WO | 2018039645 | 3/2018 |

OTHER PUBLICATIONS

Extended European Search Report from European Patent Application No. 22191315.5 notified Jan. 18, 2023, 12 pgs.

* cited by examiner

101

103

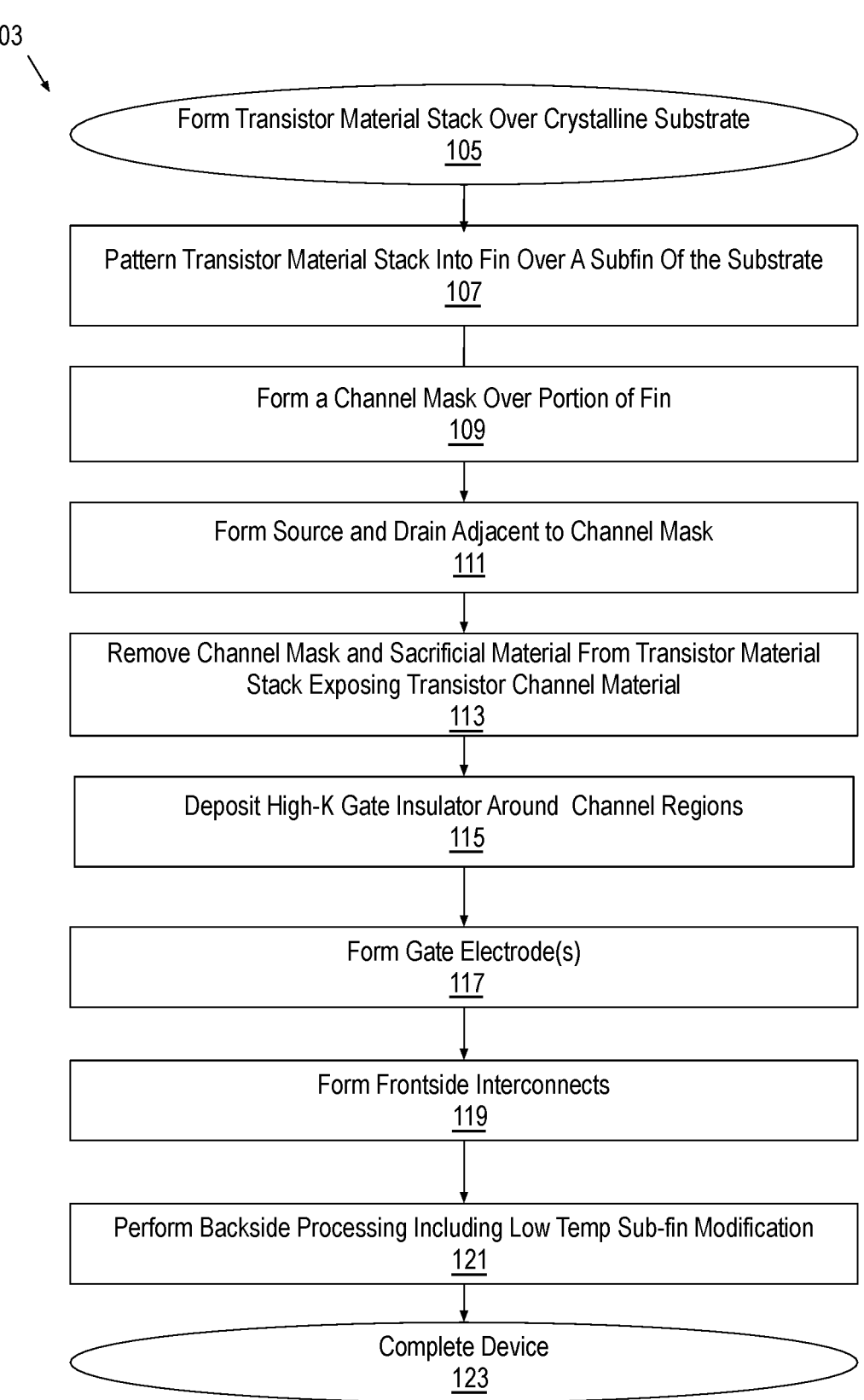

Form Transistor Material Stack Over Crystalline Substrate
105

Pattern Transistor Material Stack Into Fin Over A Subfin Of the Substrate
107

Form a Channel Mask Over Portion of Fin
109

Form Source and Drain Adjacent to Channel Mask
111

Remove Channel Mask and Sacrificial Material From Transistor Material
Stack Exposing Transistor Channel Material
113

Deposit High-K Gate Insulator Around  Channel Regions
115

Form Gate Electrode(s)
117

Form Frontside Interconnects
119

Perform Backside Processing Including Low Temp Sub-fin Modification
121

Complete Device
123

FIG. 1C

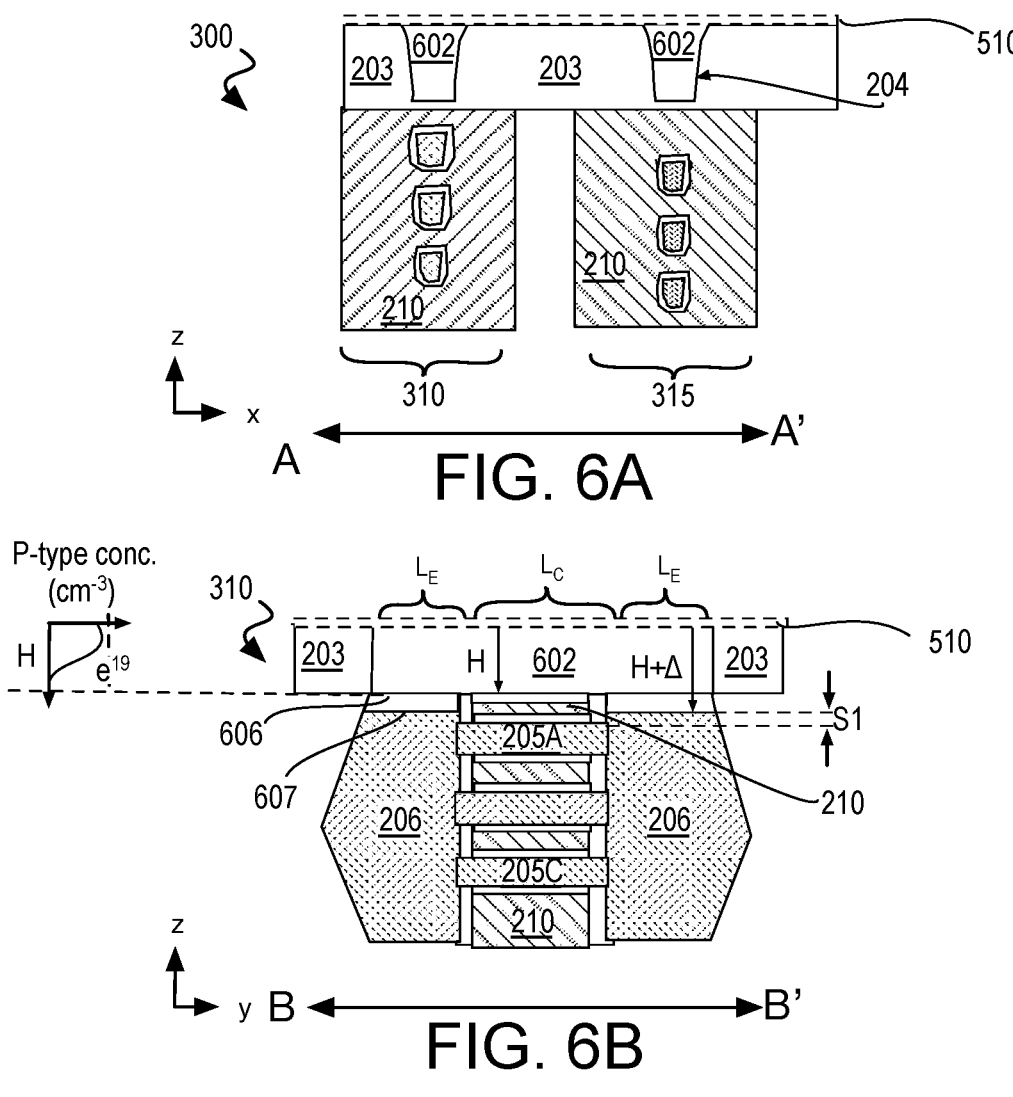
FIG. 6A
FIG. 6B
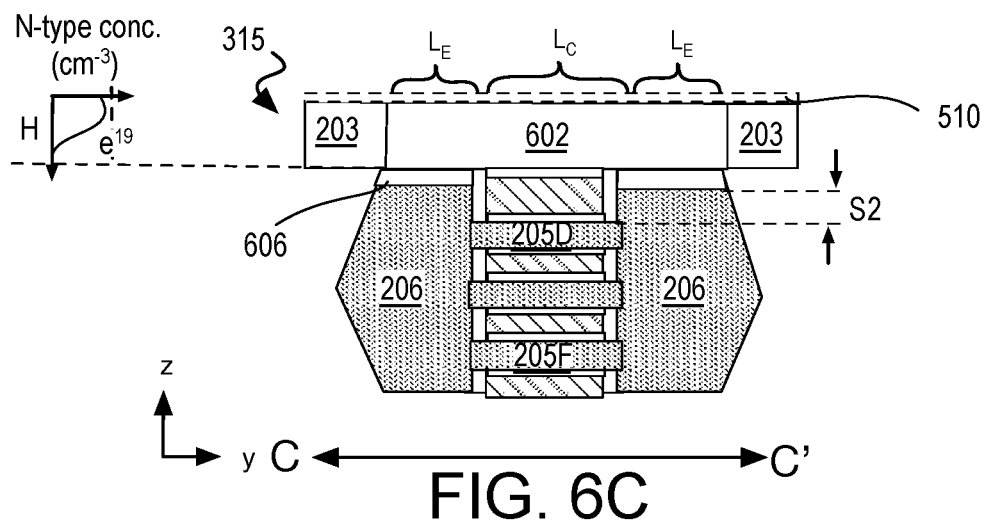
FIG. 6C

TRANSISTOR STRUCTURES WITH REDUCED SOURCE/DRAIN LEAKAGE THROUGH BACKSIDE TREATMENT OF SUBFIN SEMICONDUCTOR MATERIAL

BACKGROUND

Demand for higher performance integrated circuits (ICs) in electronic device applications has motivated increasingly complex transistor architectures. Some transistor structures include multiple layers of crystalline semiconductor channel material. Advantageously, the stack of crystalline semiconductor channel material may be epitaxially grown upon a seeding surface of a crystalline semiconductor substrate.

Channel regions of transistor structures are often coupled to epitaxial source and drain semiconductor materials that are also regrown from crystalline seeding surfaces exposed by etching through semiconductor fin material(s) that are then replaced with heavily doped source and drain semiconductor material. For higher charge carrier mobility, some transistor structures may be engineered to induce strain in the channel material, for example, by epitaxially growing source and drain semiconductor materials that are have a different lattice constant than that of the seeding surface of crystalline semiconductor substrate.

Although advantageous as a seeding surface, crystalline semiconductor material retained below a transistor structure, often referred to as a "subfin," in reference to its location at the base of a fin further including the overlying channel portion(s), can be detrimental during transistor operation. For example, mobile charge carriers may be present within the subfin, and such carriers can transit between the source and drain as driven by a source-drain bias voltage ($V_{DS}$) placed across the transistor structure. These mobile charge carriers contribute to a non-zero off-state leakage current for each transistor structure, which can combine into significant power consumption and/or reduced device battery lifetimes, etc.

Transistor architectures and fabrication techniques that can reduce off-state leakage while still enabling strain-based mobility enhancement is therefore commercially advantageous.

BRIEF DESCRIPTION OF THE DRAWINGS

The material described herein is illustrated by way of example, and not by way of limitation, in the accompanying figures. For simplicity and clarity of illustration, features in the figures are not necessarily drawn to scale. For example, the dimensions of some features may be exaggerated relative to other features for clarity. Further, where considered appropriate, reference labels have been repeated among the figures to indicate corresponding or analogous elements. In the figures:

FIG. 1C is a flow diagram illustrating methods of fabricating transistor stack structure over a crystalline semiconductor subfin and backside modification of the subfin, in accordance with some embodiments;

FIG. 6A illustrates a first cross-sectional view through the pair of transistor stack structures shown in FIG. 5A following a backside modification of the transistor stack structures, in accordance with some embodiments;

FIG. 6B illustrates a second cross-sectional view through the transistor stack structure shown in FIG. 5B following the backside modification, in accordance with some embodiments;

FIG. 6C illustrates a second cross-sectional view through the transistor stack structure shown in FIG. 5C following the backside modification, in accordance with some embodiments;

DETAILED DESCRIPTION

Figure 1A:
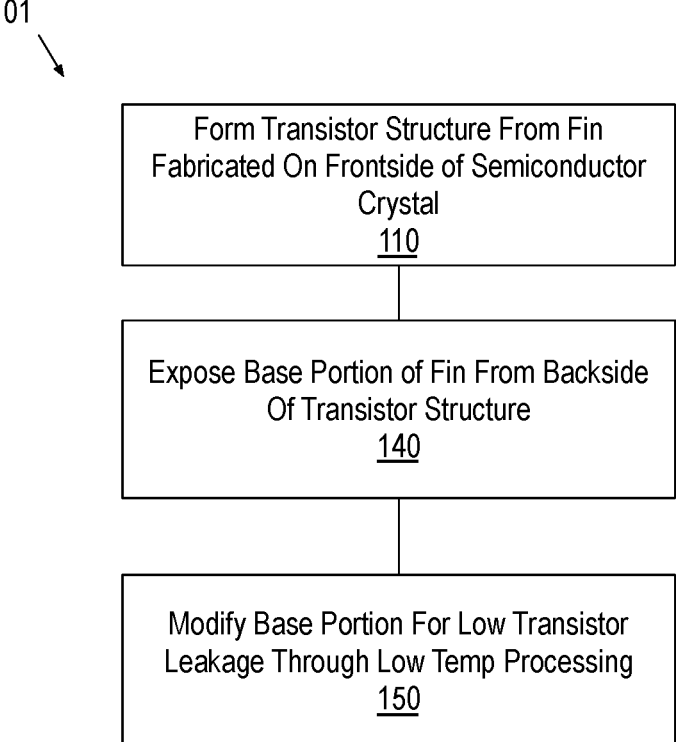
FIG. 1A is a flow diagram illustrating methods of reducing subfin leakage through backside modification, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example, in the context of materials, one material disposed over or under another material may be directly in contact or may have one or more intervening materials. Moreover, one material disposed between two materials may be directly in contact with the two materials or may have one or more intervening materials. In contrast, a first material "on" a second material is in direct contact with that second material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than half. For example, a composition that is predominantly a first constituent means more than half of the composition is the first constituent (e.g., >50 at. %). The term "primarily" means the most, or greatest, part. For example, a composition that is primarily a first constituent means the composition has more of the first constituent than any other constituent. For a composition that is primarily first and second constituents, the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

FIG. 1A is a flow diagram illustrating methods 101 for reducing subfin leakage through backside modification of the subfin, in accordance with some embodiments. At block 110, a transistor structure is fabricated over a frontside of a crystalline semiconductor substrate. As described further below, the transistor fabrication includes definition of a fin having a transistor channel material portion over a portion of the substrate referred to herein as a subfin or a "base portion" of the fin. During transistor fabrication, the base portion of the fin may serve as a seeding layer for the epitaxial growth of the channel portions of the fin and/or source and drain materials. Accordingly, and in contrast to a fin fabricated from a device layer of a semiconductor on insulator (SOI) substrate, strain may be induced in the channel material portion(s) through pseudomorphic or metamorphic growth of the channel material and/or pseudomorphic or metamorphic growth of source/drain materials upon the seeding layer.

Following fabrication of the transistor structure(s), frontside processing may continue with the formation of one or more levels of interconnect metallization. Methods 101 then continue at block 140 where backside processing exposes a back side of the base portion of the fin, for example through a planarization process (e.g., CMP) and/or any other technique for thinning or removing substrate thickness. In accordance with embodiments, off-state transistor leakage may be reduced through backside processing at block 150 that modifies the composition and/or microstructure of the base portion of the fin to reduce charge carrier transport through the base portion. As described further below, modification of the base portion of a fin may proceed from the back side of the transistor structure in a manner that will not degrade the channel material layer(s) or other frontside structures. For example, channel portions of a fin may be masked from backside modification of the base portion by a gate stack. Also, backside modification of the base portion of the fin may rely on low temperature processing (e.g., <425° C.), which is compatible with transistor structures and/or any frontside interconnect metallization.

Figure 1B:
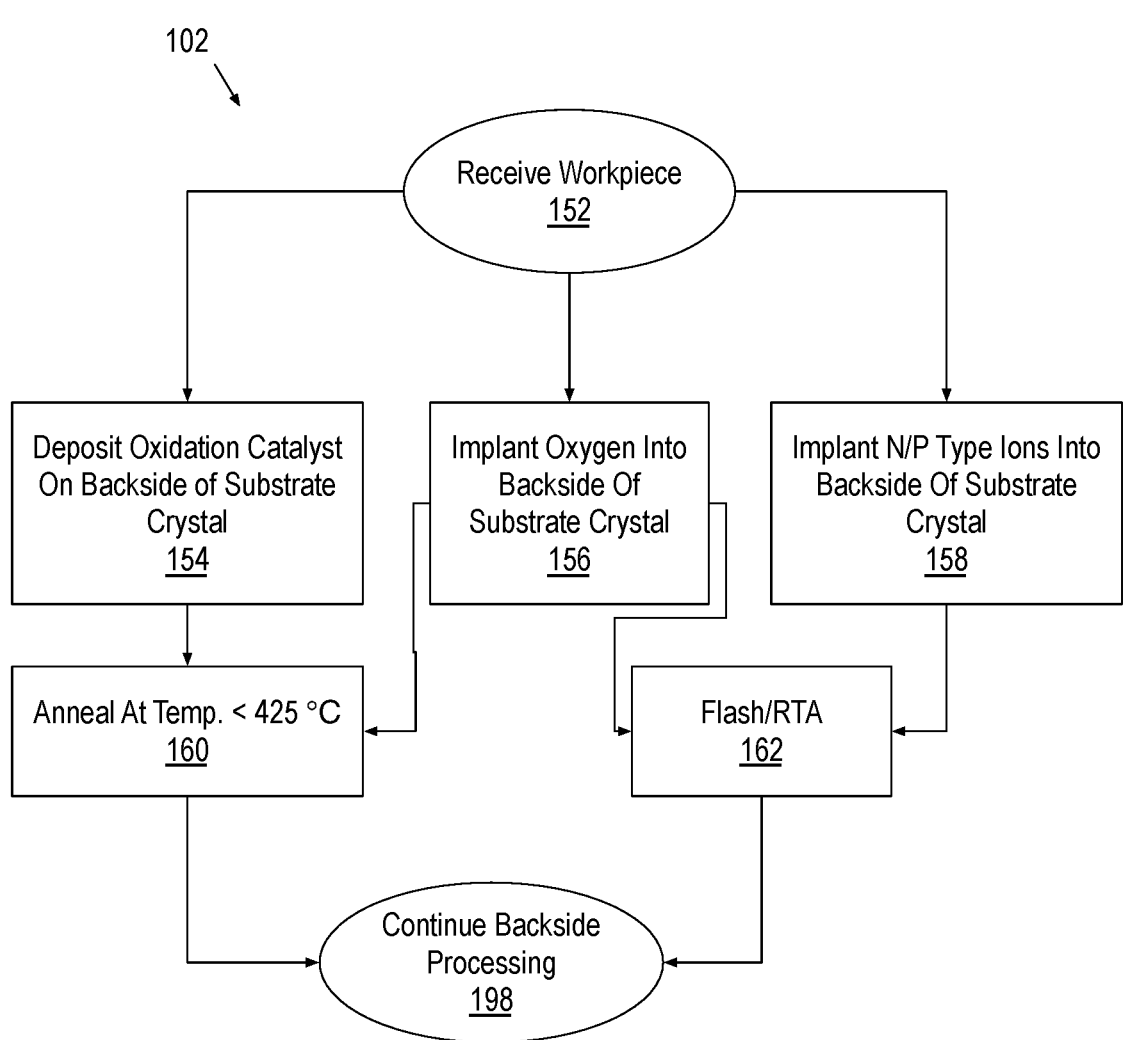
FIG. 1B is a flow diagram illustrating backside subfin modification methods, in accordance with some embodiments.

FIG. 1B is a flow diagram illustrating backside subfin modification methods 102, in accordance with some embodiments. Through the practice of methods 102, transistor structures may have improved performance, displaying for example less source/drain leakage. Methods 102 begin at input 152 where a workpiece, such as a large format (e.g., 300 mm, or more) wafer is received. The workpiece includes one or more layers of transistor channel material over a planar surface of a (single)crystalline substrate. If there is more than one layer of channel material, channel material layers may be separated by an intervening sacrificial crystalline material, for example as described further below.

The workpiece received at input 152, as fabricated upstream of methods 102, includes transistor structures that are electrically interconnected by one or more levels of interconnect metallization located over a frontside of the transistor structures, opposite the substrate. The transistor structures may be any of planar or non-planar architecture. In some exemplary non-planar embodiments, the transistor structures comprise a fin of (single)crystalline channel portions in a stack with a gate electrode between each of the channel portions. Opposite ends of the channel portions are coupled to source and drain material. The interconnect metallization is further coupled to etch of the gate electrode and source and drain material.

In exemplary embodiments, the transistor channel portions are epitaxial to a front side, seeding, surface of the (single)crystalline substrate. The crystalline substrate may be substantially pure silicon, comprise both silicon and germanium, comprise tin and germanium or silicon, or be substantially pure germanium, for example. In some embodiments, the channel portions have the same composition as the substrate, and therefore have the same lattice constant with no lattice mismatch to the substrate. In other embodiments, the channel portions have a different composition than the substrate and are pseudomorphic where lattice mismatch may advantageously induce a strain within the channel portions to improve carrier mobility.

The source and/or drain materials are also advantageously epitaxial to a front side, seeding, surface of the (single) crystalline substrate. Aside from greater donor or acceptor impurity concentration, the source and drain material may have the same composition as the substrate, and may therefore have the same lattice constant as the substrate. In other embodiments, in addition to a greater donor or acceptor impurity concentration the source and drain material has a different majority atom composition than the substrate. The source and drain materials may be advantageously pseudomorphic or metamorphic relative to the substrate, which may also induce a strain within the channel portions to improve carrier mobility.

Following frontside fabrication of the IC structure, the workpiece is transferred to a frontside carrier and backside processing commences. The backside processing may entail any wafer thinning or separation process(es) suitable for approaching to within 10-100 nm of the transistor structure, and more specifically, approaching a base portion of the fin comprising the (single)crystalline substrate material. The base portion of the fin may then be modified through additional backside processing to reduce source/drain leakage according to embodiments herein.

In first embodiments, methods 102 modify the base portion of the fin from the crystalline substrate material into an electrically insulative amorphous material through the introduction of oxygen. In some embodiments, an oxidation catalyst is deposited on the backside of the substrate crystal at block 154. The oxidation catalyst may be deposited as a thin film upon the backside of the base portion of the fin using any deposition technique. The catalyst enhances the oxidation rate of the substrate crystal and/or enables an amount of substrate oxidation to occur at a lower temperature than otherwise possible in absence of the catalyst. In some embodiments, the catalyst comprises a metal, such as, but not limited to, aluminum. In an example where the substrate comprises silicon (e.g., substantially pure silicon), the oxidation catalyst comprises a metal oxide (e.g., alumina or $Al_2O_3$). The inventors have found that deposition of 2-3 nm of $Al_2O_3$ can promote oxidation of 10-15 nm of silicon when annealed at block 160 in an oxygen environment (e.g., 2-5% $O_2$) at temperatures of only 375-425° C. As the aluminum is a catalyst of the silicon oxidation, it remains on a backside of the base portion of the fin after the oxidation process and, with the form oxide providing a good electrical insulator, need not be subsequently removed from the IC structure.

In some other embodiments, oxygen is implanted into the backside of the base portion of the fin using any suitable implantation technique. For example, the backside of the base portion of the fin may be exposed to an oxygen plasma at block 156. Plasma bias may be controlled to implant oxygen into the base portion of the fin to a desired depth. Such plasma oxidation processes may be performed at low temperature (e.g., standard room temperature) followed by the low temperature bulk anneal at block 160 (e.g., again at a temperature of 375-425° C.). Alternatively, the backside of the base portion of the fin may be exposed to a beamline implant at block 156 followed by low temperature bulk anneal at block 160. In other embodiments, a flash, laser, or other rapid thermal anneal (RTA) process may be practiced at block 162. Because the anneal performed at block 162 entails localized heating from a backside of the transistor structure, channel portions of a fin more distal from the backside need only be exposed to low temperatures comparable to those of the low temp anneal at block 160 (e.g., <425° C.). In other embodiments, plasma oxidation may be performed at some anneal temperature (i.e., combining blocks 156, and 160). Blocks 154 and 156 may also be combined, for example performing a post catalyst deposition anneal with a plasma oxidation process, which may be followed with either the low temperature bulk anneal at block 160, or localized backside anneal at block 162. In other embodiments, a hot beamline implant may be performed (i.e., combining blocks 156, and 160).

In second embodiments, methods 102 proceed to block 158 where the base portion of the fin is modified to have a conductivity type complementary to that of the transistor source and drain materials by implanting donor or acceptor dopant species. Such counter doping of the fin base portion will reduce carrier transport through junction isolation. In these embodiments, the base portion of the fin remains (single)crystalline, but further includes donor impurities for PMOS transistor structures and acceptor impurities for NMOS transistor structures. As described below, the impurity species within the base portion of the fin will have a concentration profile through the base portion thickness that is indicative of a backside implantation process. Following impurity implantation, the impurities may be electrically activated at block 162 with any backside-localized thermal treatment, for example.

Methods 102 may be completed at output 198 where any additional backside processing may be performed accordingly to any known techniques. Although the subfin modification methods 102 are applicable to any transistor structure, FIG. 1C is a flow diagram further illustrating methods 103 for fabricating a transistor stack structure over a crystalline semiconductor subfin followed by backside modification of the subfin, in accordance with some exemplary embodiments.

Methods 103 begin at input 105 where a transistor channel material stack is grown epitaxially to the substrate seeding surface. The transistor channel material includes a plurality of bi-layers comprising a sacrificial material and a channel material. In some NMOS embodiments, the sacrificial material layers include more germanium than the channel material layers. For example, where the channel material is substantially pure silicon, sacrificial material layers are $Si_{1-x}Ge_x$, where X is between 0.3-0.35. In some PMOS embodiments, the sacrificial material layers include less germanium than the channel material layers. For example, where the channel material is $Si_{1-x}Ge_x$, with X is between 0.3-0.35, the sacrificial material is substantially pure silicon. Advantageously, the channel material layers and sacrificial layers are epitaxial to the substrate seeding surface.

At block 107, the transistor channel material stack is patterned into a fin. Any patterning process, such as a spacer-based lithographic pitch-reduction patterning process, may be practiced at block 107. Any subtractive etch may be practiced at block 107 to delineate features (e.g., fins) into the channel material stack. In some embodiments, a plasma etch process may be utilized to define fins. The patterning process carried out at block 107 also etches a portion of the underlying crystalline substrate (e.g., silicon), which is referred to herein as the base portion of the fin.

At block 109 a channel portion of the features patterned at block 107 is protected with a channel mask. The channel mask may include one or more material layers. Prior to forming the channel mask, a dielectric material may be deposited over the fin of stacked channel materials, and on sidewalls of the fin. The dielectric may then be planarized so a top surface of the dielectric material is substantially coplanar with a top surface of the fin. The planar dielectric material may be recessed to a level at, or below, one or more of the channel materials in the stack. In some embodiments, the channel mask formed over exposed portions of the fin includes a sacrificial gate stack. Optionally, a spacer dielectric may be deposited over the channel mask and anisotropically etched to form a spacer around the channel mask.

Methods 103 continue at block 111 where source and drain regions are formed adjacent to the channel mask and/or spacer. Block 111 may include the removal of at least the sacrificial material layers from between the channel material layers, and may further include a recess etch of the channel material layers. Following the channel material stack etch(es), source and drain material may be epitaxially grown in contact with the channel material layers of the fin and in contact with exposed ends of the base portion of the fin. In some embodiments, the source and drain structures are epitaxially grown with a low pressure CVD (LPCVD) process. For PMOS transistor structures, silicon or $Si_{1-x}Ge_x$, may be epitaxially grown with one or more in-situ acceptor/p-dopants, such as boron, gallium, indium, or aluminum. For NMOS transistor structures, silicon may be epitaxially grown with one or more donors/n-dopants such as phosphorus, arsenic, or antimony.

Methods 103 continue at block 113 where the channel mask is removed and sacrificial material stripped from between channel portions of the exposed stack of channel materials. In some embodiments, a wet chemical etch process is utilized to remove the sacrificial layers selectively from intervening channel materials to expose the channel portions as nanosheets. Following the exposure of channel portions, methods 103 continue with the deposition of gate insulator material at block 115. In some embodiments, a high-k gate material layer is deposited by an atomic layer deposition (ALD) process. A chemical oxide may be first formed on the channel portions, for example without breaking vacuum, prior to the ALD process. The chemical oxide may be formed by any of thermal oxidation, plasma-assisted oxide, UV-assisted oxidation, or thermal ALD. The oxide growth may be substantially isotropic, growing to a self-limiting thickness of 1.0 nm, for example. The subsequent ALD process similarly facilitates conformal coverage of fin channel portions with any known high-k (e.g., >8.5) material.

Methods 103 continue at block 117 where one or more gate electrodes are formed around the gate insulators. In some embodiments, gate electrode formation includes deposition of one or more work function metals. The work function metal may be deposited by ALD or chemical vapor deposition (CVD), for example. Gate electrode formation may further include deposition of fill metal, such as, but not limited to, W. Gate electrode formation may further include deposition of a diffusion barrier, such as, but not limited to TiN, MoN, WN, TaN, or NbN. The diffusion barrier may be deposited between the work function metal and at least one of the gate insulator and the fill metal (i.e., on either side of the work function metal).

Following block 117, the transistor structure is substantially complete and may be interconnected with other transistor structures through one or more levels of interconnect metallization formed at block 119 according to any backend of line (BEOL) fabrication processes known to be suitable for integrated circuits (ICs).

At block 121, backside processing of the workpiece is performed. The backside processing includes a backside modification of the base portion of the fin to reduce off-state transistor leakage. In some exemplary embodiments, methods 102 are performed at block 121 to modify the base portion of the fin through oxidation or counter doping, substantially as described above. Methods 103 may then be completed with any additional backside processing at block 123, for example to form backside interconnect metallization, etc.

Figure 2A:
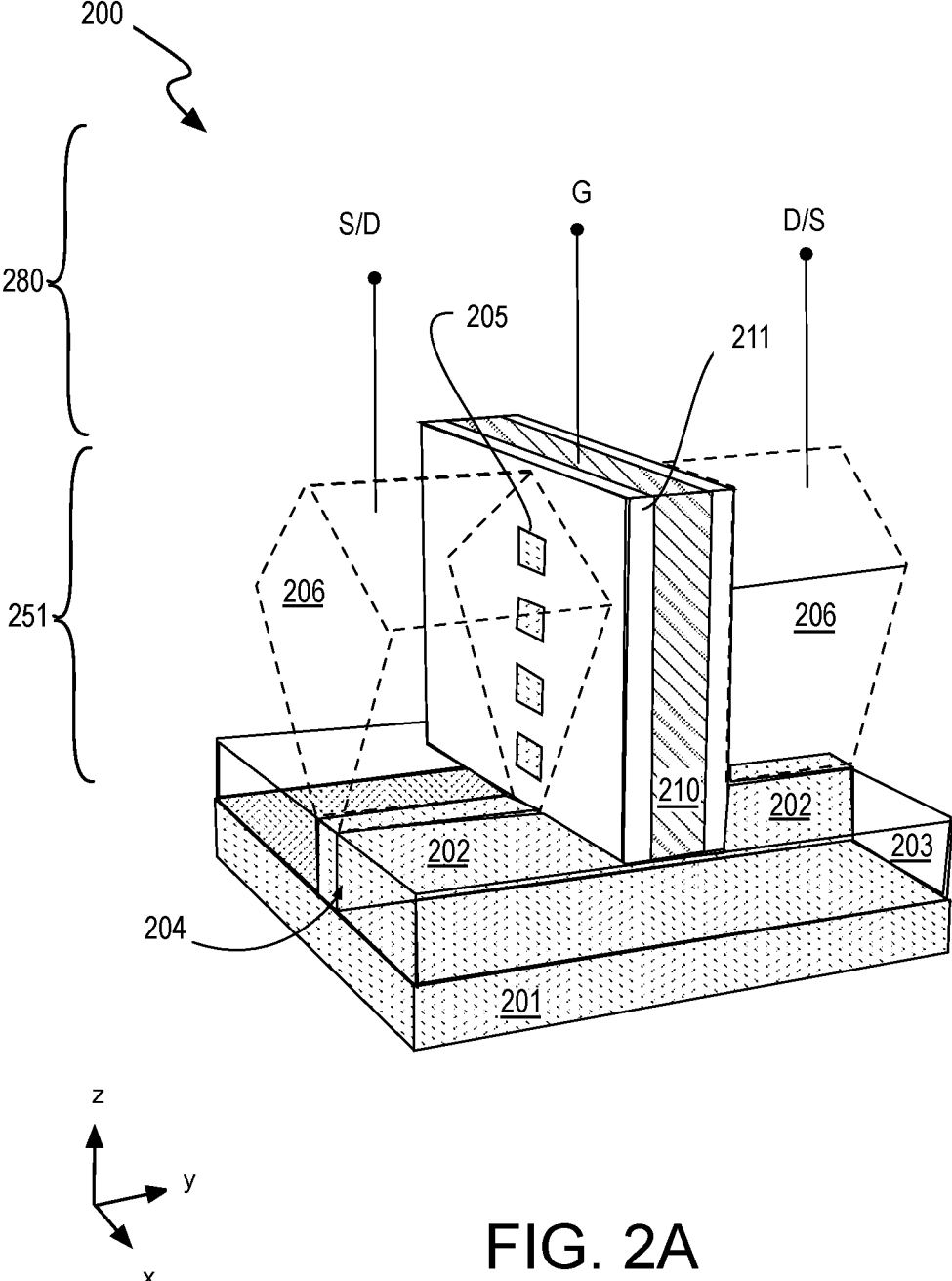
FIG. 2A illustrates an isometric sectional view of a transistor stack structure fabricated over a front side of a crystalline semiconductor subfin, in accordance with some embodiments.

FIG. 2A illustrates an isometric sectional view of an IC structure 200, in accordance with some embodiments. IC structure 200 includes a transistor structure 251 that includes a plurality of stacked channel portions 205. Transistor structure 251 is illustrated as including four active channel portions, but a transistor structure may include any integer number of channel portions (e.g., 1, 2, 3, 4, 5 . . . 10 . . . 20, etc.) in a vertical stack as embodiments herein are not limited in this respect.

Channel portions 205 may have any geometry, such as the nanowire structures shown in FIG. 2A, or nanoribbons with wider lateral width than vertical height. Furthermore, although one stack of channel portions 205 are illustrated, a transistor may include any number of stacks of channel portions. For example, a forksheet device may include a gate electrode between two stacks of channel portions.

Source and drain materials 206 are coupled together through channel portions 205. In such a transistor structure, each of channel portions 205 may be operable to contribute to a total drive current of (e.g., a PMOS or NMOS) transistor structure 200. As further illustrated, channel portions 205 and source/drain materials 206 are directly over a fin base portion 202, which extends from substrate 201. The base portion 202 and substrate 201 are therefore (single)crystalline material and may have substantially the same chemical composition. An isolation dielectric material 203 is laterally adjacent to a base portion sidewall 204, and over any portion of substrate 201 where no fin is present. Isolation dielectric material 203 may include one or more layers of dielectric material, such as one comprising silicon (e.g., SiO, SiOC, SiN, SiON, SiONC, etc.). Although not illustrated, in some multi-layered embodiments, a first layer of isolation dielectric material 203 (e.g., comprising primarily Si and N) may conformally follow base portion sidewall 204, while a second layer of isolation dielectric material 203 (e.g., comprising primarily Si and O) non-conformally fills gaps between adjacent base portions 202.

In the example shown in FIG. 2A, source and drain material 206 comprise faceted epitaxial material that has been regrown, for example laterally from an end portion of channel portions 205 and/or from end lengths of the fin base portion 202. For a PMOS FET, source and drain material 206 is P-type (i.e., with acceptor impurities). For an NMOS FET, source and drain material 206 is N-type (i.e., with donor impurities). Although illustrated with exemplary facets, source and drain material 206 may be less faceted (more blob-like) than illustrated.

In some exemplary embodiments, channel portions 205 have a relaxed lattice constant that is different than the relaxed lattice constant of base portion 202. For example, substantially pure crystalline silicon has a relaxed lattice constant of approximately 0.345 nm while substantially pure crystalline germanium has a relaxed lattice constant of approximately 0.566 nm. For $Si_xGe_{1-x}$ alloys, the relaxed lattice constant can be approximated by linear interpolation as a function of x. In exemplary embodiments, channel portions 205 are pseudomorphic. Being pseudomorphic, the in-plane (e.g., x-y) lattice parameter of channel portions 205 coherently strains from its relaxed lattice constant through elastic deformation so that the in-plane lattice constant of channel portions 205 matches the in-plane lattice constant of base portion 202.

Depending on the majority lattice atom compositions of channel portions 205 and base portion 202, the pseudomorphic state of channel portions 205 may be either elastically compressed bi-axially in the two in-plane directions (x and y), or elastically tensed in the two in-plane directions. Hence, in some exemplary embodiments where base portion 202 is substantially pure silicon, and channel portions 205 are pseudomorphic $Si_xGe_{1-x}$, channel portions 205 become more compressively strained with increasing Ge composition. For such embodiments, transistor structure 200 is advantageously a PMOS device in which charge carriers (holes) traversing channel portions 205 will enjoy higher mobility as a result of the compressive strain. In one specific PMOS example where base portion 202 is substantially pure silicon, channel portions 205 are pseudomorphic $Si_{0.7}Ge_{0.3}$. In some other exemplary embodiments, base portion 202 may be $Si_yGe_{1-y}$ and channel portions 205 pseudomorphic $Si_xGe_{1-x}$, where x is less than y.

In some other exemplary embodiments, base portion 202 is pure Ge or $Si_yGe_{1-y}$ and channel portions 205 are pseudomorphic Si or $Si_xGe_{1-x}$, where x is greater than y. For such embodiments, channel portions 205 become more tensilely strained with decreasing Ge composition. Transistor structure 200 may then be advantageously an NMOS device in which charge carriers (electrons) traversing channel portions 205 have a higher mobility as a result of the tensile strain. In one specific NMOS example where base portion 202 is substantially pure Ge, channel portions 205 are pseudomorphic $Si_{0.3}Ge_{0.7}$.

Source and drain materials 206 may be relaxed or strained. As one PMOS example, base portion 202 and channel portions 205 are both substantially pure silicon while source and drain materials 206 are metamorphic (relaxed) SiGe (e.g., $Si_{0.7}Ge_{0.3}$). The greater relaxed lattice constant of the source and drain materials 206 may induce a compressive strain on the intervening channel portions 205.

Gate electrode 210 is between source and drain material 206, with intervening spacer dielectric material 211 between gate electrode 210 and source and drain material 206. Gate electrode 210 may include an elemental metal layer, a metal alloy layer, or laminate structure of either or both elemental and alloy layers. Gate electrode 210 may have any composition suitable for the composition of channel portions 205, such as any of those described above in the context of methods 103. In some embodiments, gate electrode 210 is a metal nitride, such as TiN. Gate electrode 210 may also comprise Al (e.g., TiAlN), for example. Other alloy constituents may also be present in gate electrode 210, such as, but not limited to, C, Ta, W, Pt, and Sn.

IC structure 200 further includes any number of metallization levels 280 over a "top" or "front" side of transistor structure 251, for example. Metallization levels 280 may have any known structure, and any number of levels interconnecting one or more transistor terminals with other nodes in an IC. Structural aspects metallization levels 280 are not depicted in FIG. 2 to avoid obscuring transistor structure 251. Although not depicted for the sake of clarity, metallization levels 280 may include a source and/or drain contact that is similarly in contact with source and drain regions 206. Likewise, front-side metallization levels 280 may further include a contact (not depicted) to gate electrode 210.

Figure 2B:
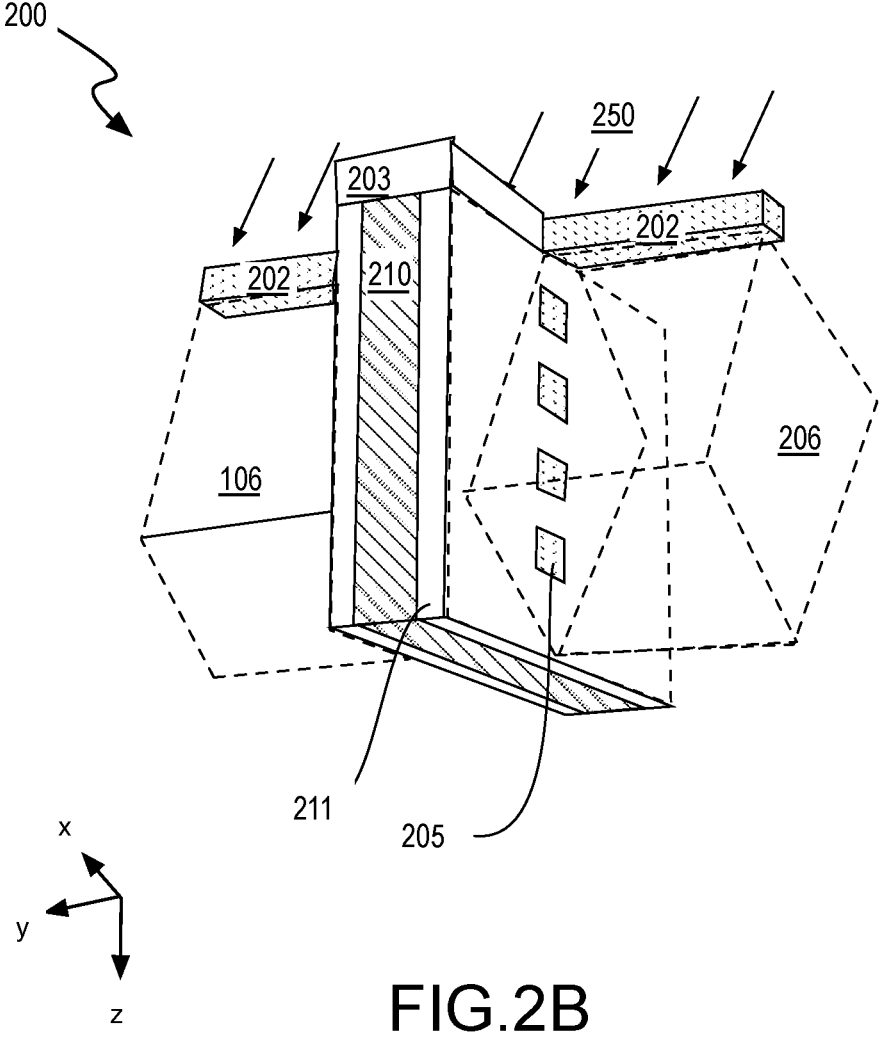
FIG. 2B illustrates an isometric sectional view of a backside modification of the transistor stack structure introduced in FIG. 2A, in accordance with some embodiments.

FIG. 2B illustrates an isometric sectional view of backside modification of the IC structure 200, in accordance with some embodiments. In some examples, methods 103 (FIG. 1C) are practiced to first fabricate the IC structure 200, as illustrated in FIG. 2A, and then to modify the IC structure 200, as further illustrated in FIG. 2B, so as to reduce off-state leakage of transistor structure 251. In FIG. 2B, IC structure 200 has been inverted and substrate 201 thinned and/or removed to expose fin base portion 202, as well as the adjacent isolation dielectric 203. Therefore, the backside modification process 250 may be performed locally upon base portion 202. In exemplary embodiments, any of methods 102 (FIG. 1B) may be practiced as backside modification process 250.

Figure 3:
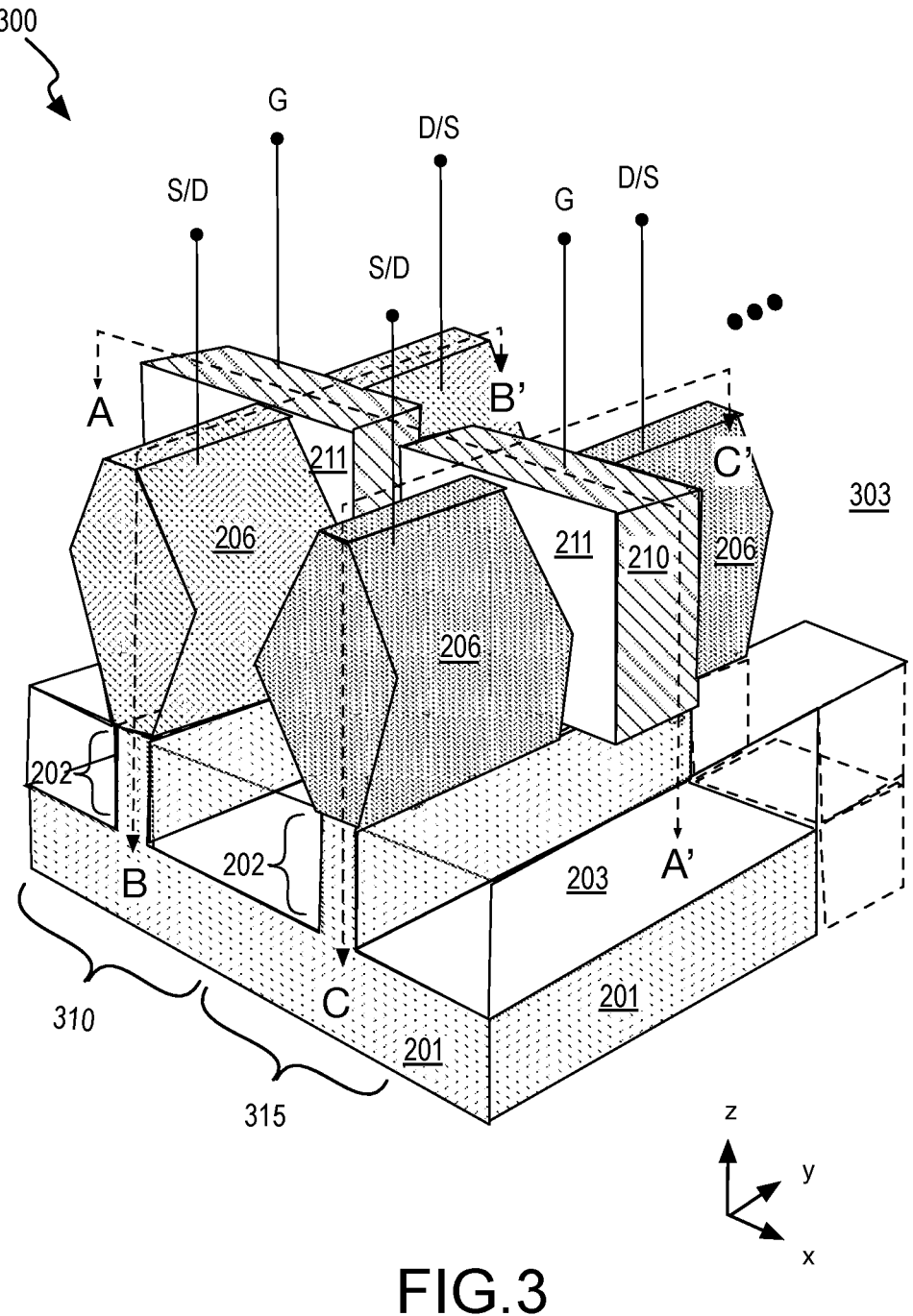
FIG. 3 illustrates an isometric view of a pair of transistor stack structures fabricated over a front side of a crystalline semiconductor subfin, in accordance with some embodiments.

FIG. 3 illustrates an isometric view of an IC structure 300 including two transistor structures 310 and 315, in accordance with some CMOS embodiments. IC structure 300 illustrates only a portion of a monolithic IC that may further include any number of metallization layers (not depicted) that electrically interconnect gate (G), source (S) and drain (D) terminals of transistor structures 310, 315 to various circuit nodes. In this example, each of transistor structures 310 and 315 is a metal-oxide-semiconductor field effect transistor (MOSFET) that includes a substantially monocrystalline semiconductor material for at least their channel portions. In exemplary embodiments, each of transistor structures 310 and 315 comprise the stack of channel portions 205 over fin base portion 202, for example substantially as illustrated in FIGS. 2A and 2B.

Figures 4A, 4B, 4C:
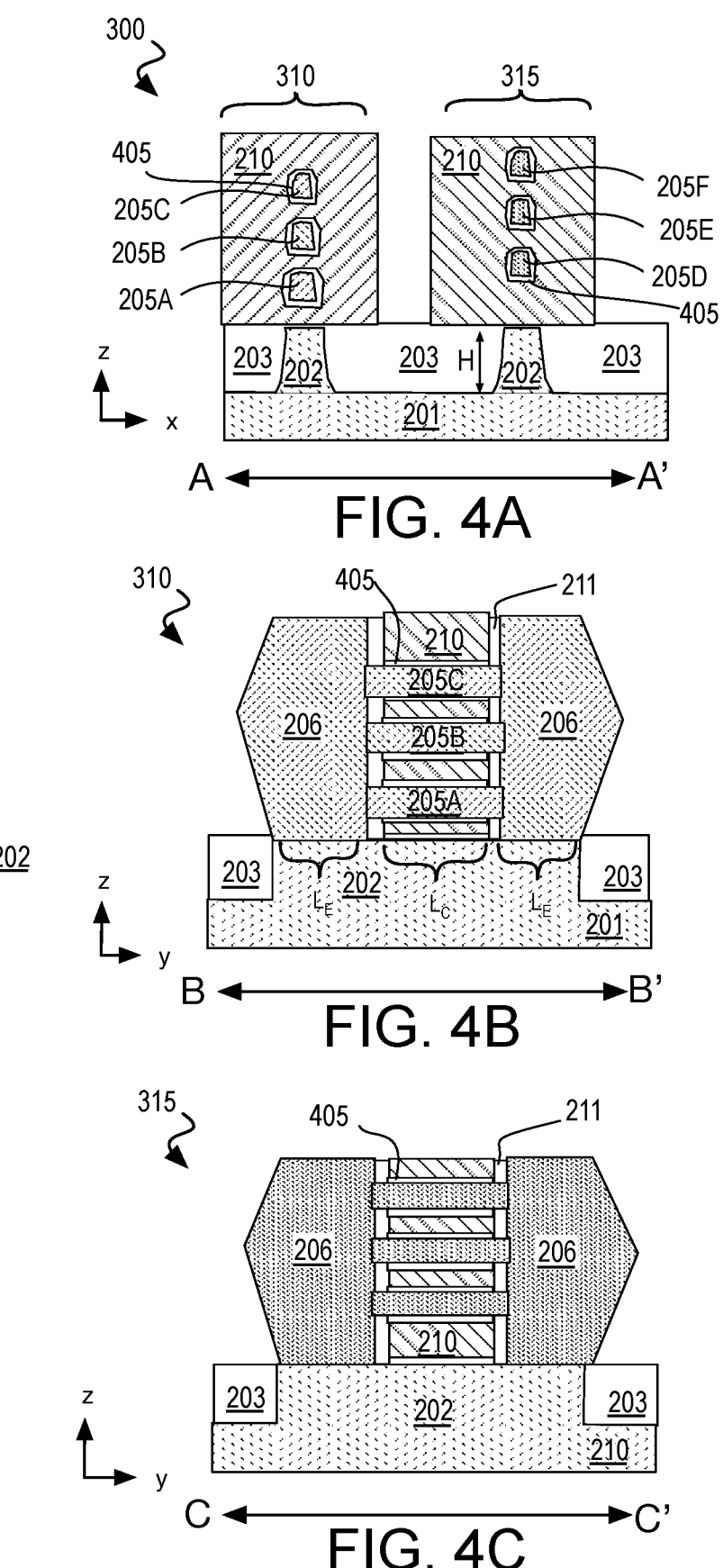
FIG. 4A illustrates a first cross-sectional view through the pair of transistor stack structures illustrated in FIG. 3, in accordance with some embodiments.
FIG. 4B illustrates a second cross-sectional view through a first of the transistor stack structures illustrated in FIG. 3, in accordance with some embodiments.
FIG. 4C illustrates a second cross-sectional view through a second of the transistor stack structures illustrated in FIG. 3, in accordance with some embodiments.

FIGS. 4A, 4B, and 4C illustrate cross-sectional views of IC structure 300 along A-A', B-B' and C-C' planes introduced in FIG. 3, respectively. FIG. 4A illustrates a section through transistor channel portions 205A-205C and 205D-205F of transistor structures 310 and 315, respectively. As shown, a gate insulator 405 separates gate electrode 210 from channel portions 205A-205F. Gate insulator 405 may be any material known to be suitable for a particular channel material. In some exemplary embodiments, gate insulator 405 is high-k dielectric material (e.g., with a bulk relative permittivity greater than 7.5). Exemplary high-k materials include dielectric metal oxides. In some examples, gate insulator 405 comprises oxygen and at least one of Hf (e.g., $HfO_2$), Al (e.g., $Al_2O_3$), Zr (e.g., $ZrO_2$), Y (e.g., $Y_2O_3$), Ta (e.g., $Ta_2O_5$), or Ti (e.g., $TiO_2$) Silicates, such as, but not limited to $HfSiO_x$, or $TaSiO_x$ may also be suitable. In other embodiments gate insulator 405 is $SiO_2$, or SiON.

As further illustrated in FIG. 4A, channel portions 205A, 205B and 205C are positioned at first heights relative to base portion 202 while channel portions 205D, 205E and 205F are positioned at second heights relative to base portion 202. For the exemplary CMOS embodiments, each of NMOS channel portions 205A-205C may have been removed from between PMOS channel portions 205D-205F to form transistor structure 315 while each of PMOS channel portions 205D-205F may have been removed from between channel portions NMOS channel portions 205A-205C to form transistor structure 310. Base portion 202 has a subfin height H, that may vary with implementation. In some embodiments, subfin height H is 5-30 nm, and advantageously extends less than 10 nm from crystalline substrate 201.

FIG. 2B illustrates a longitudinal cross-section of NMOS transistor structure 310. As shown, channel portions 205A-205C extend between source and drain material 206, passing through gate sidewall spacer 211. Fin base portion 202 includes a center length $L_C$ below channel portions 205A-205C. Over the center length $L_C$, the gate stack (including both gate electrode 210 and gate insulator 405) is between, and in direct contact with, base portion 202 and channel portion 205A. End lengths $L_E$ are at first and second opposite ends of base portion 202. Within end lengths $L_E$, source and drain material 206 is in direct contact with base portion 202. FIG. 2C illustrates a longitudinal cross-section of PMOS transistor structure 315. As shown, channel portions 205D-205F also extend between extrinsic source and drain material 206, passing through gate sidewall spacer 211. Fin base portion 202 includes a center length $L_C$ below channel portions 205D-205F.

Figures 5A, 5B, 5C:
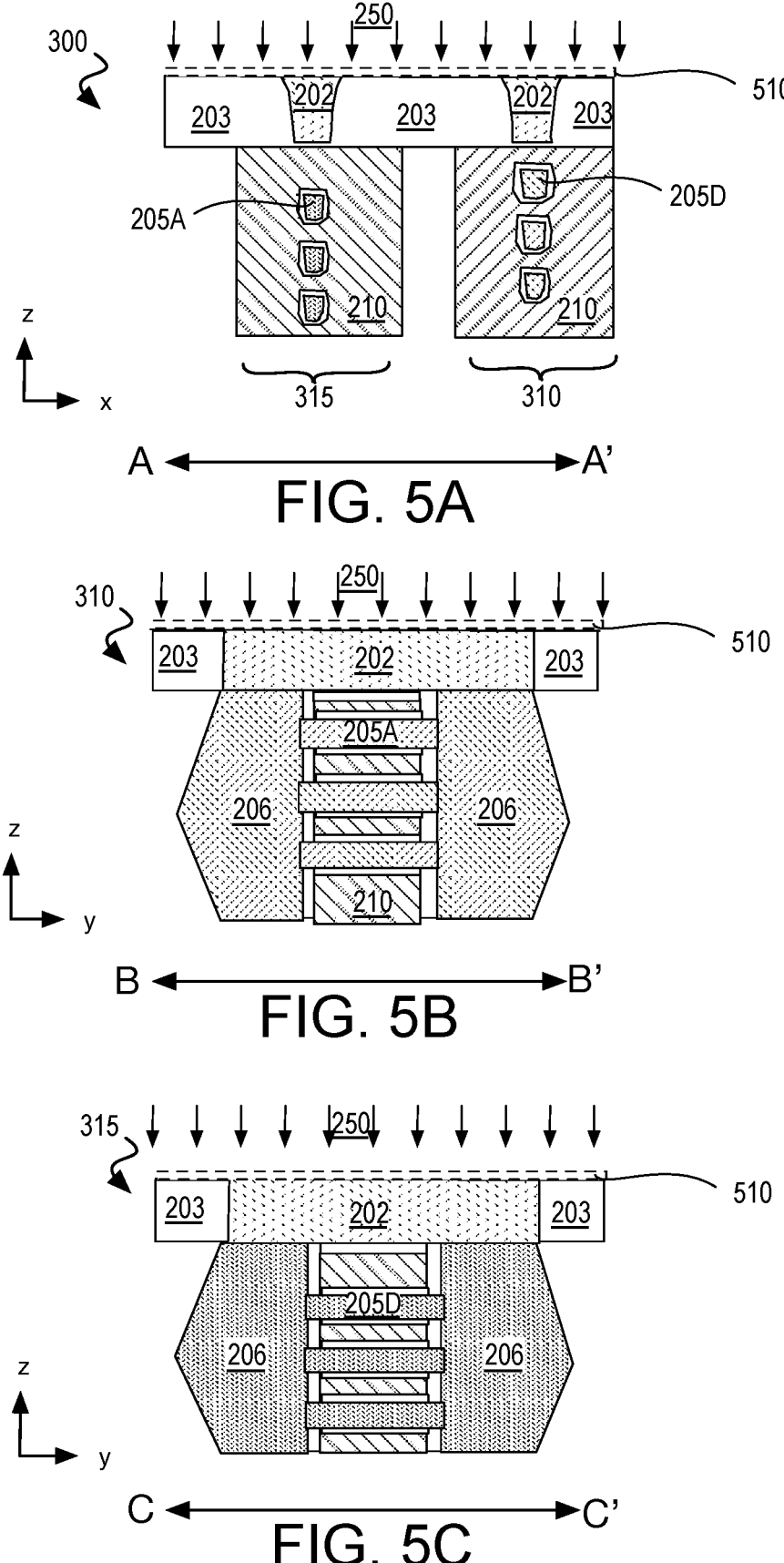
FIG. 5A illustrates a first cross-sectional view through the pair of transistor stack structures shown in FIG. 4A following a reveal of a backside of the transistor stack structures, in accordance with some embodiments.
FIG. 5B illustrates a second cross-sectional view through the transistor stack structure shown in FIG. 4B following the reveal of the backside, in accordance with some embodiments.
FIG. 5C illustrates a second cross-sectional view through the transistor stack structure shown in FIG. 4C following the reveal of the backside, in accordance with some embodiments.

FIG. 5A further illustrates the IC structure 300 along the A-A' sectional plane following initial backside processing that thins and/or removes crystalline substrate 201 to expose a backside of fin base portion 202 as well as a backside of isolation dielectric 203. Base portion modification process 250 is illustrated as being directed at, and/or localized to, the backside of IC structure 300. Modification process 250 may be performed for both transistor structures 310 and 315 concurrently, or separately, in succession. FIG. 5B and FIG. 5C further illustrate modification process 250, as practiced on the backside of each of NMOS transistor structure 310 and PMOS transistor structure 315.

As noted above, modification process 250 may comprises deposition of an oxidation catalyst 510, illustrated in FIG. 5A-5C as a thin film in direct contact with fin base portion 202. As noted above, oxidation catalyst 510 may comprise metal, and more specifically comprise a metal oxide, such as, but not limited to $Al_2O_3$. Although depicted as a nonselective deposition, a selective deposition that forms oxidation catalyst 510 only upon fin base portion 202 may also be possible.

Alternatively, where modification process 250 comprises implantation of dopant impurities, fin base portion 202 of NMOS transistor 310 may be doped with an acceptor impurity to have a p-type conductivity. The complementary conductivity type of base portion 202 may provide junction isolation to n-type source and drain material 206, improving off-state leakage between source and drain materials 206. Exemplary acceptor impurities having good activation efficiencies include, but are not limited to, boron. Whereas a relatively low concentration of such acceptor impurities (e.g., less than $1e17/cm^3$) may be sufficient for junction isolation, the acceptor dopant concentration may also be significantly higher (e.g., $1e18$-$1e19/cm^3$).

Fin base portion 202 of PMOS transistor 315 may be similarly doped with a donor impurity to have n-type conductivity. The complementary conductivity type of base portion 202 may again provide junction isolation to source and drain material 206, improving electrical isolation. Exemplary donor impurities having good activation efficiencies include, but are not limited to, arsenic or phosphorus. Whereas a relatively low concentration of such donor impurities (e.g., less than $1e17/cm^3$) may be sufficient for junction isolation, the donor dopant concentration may also be significantly higher (e.g., greater than $1e18$-$1e19/cm^3$).

FIG. 6A-6C further illustrates the IC structure 300 along the A-A', B-B' and C-C' sectional plane following a low temperature anneal, or a flash, laser or rapid thermal anneal. Modified base portions 602 are illustrated without shading to emphasize the modification of base portions 202 (illustrated in FIG. 5A-5C). For example, following deposition of oxidation catalyst 510, a low temperature anneal may be performed to oxidize fin base portion 202, converting it to an amorphous dielectric material. Alternatively, plasma oxidation and/or flash/RT anneal processes described above may similarly oxidize base portions 202 into an amorphous dielectric material comprising oxygen and the majority atoms that previously made up the (single) crystalline fin base portions 202. For example, where fin base portions 202 are substantially pure silicon, modified base portions 202 are primarily oxygen and silicon. Where fin base portions 202 are substantially pure germanium, modified base portions 202 are primarily oxygen and germanium. Where fin base portions 202 are an alloy of germanium and silicon, modified base portions 202 are primarily oxygen, germanium, and silicon.

For embodiments where isolation dielectric 203 comprises primarily silicon and oxygen, an oxidized base portion 602 (e.g., of Ge and O) may have a chemical composition distinct from that of isolation dielectric 203. However, for other embodiments (e.g., where the oxidized base portion comprise primarily Si and O) the chemical composition of modified base portion 602 may be nearly the same as that of isolation dielectric. Nevertheless, base portion sidewall 204 should remain as a topographic interface with isolation dielectric 203 indicative of base portion modification. Sidewall 204 may be particularly well decorated for embodiments where isolation dielectric 203 includes a conformal dielectric material layer (e.g., of SiN, etc.). In FIG. 6A-6C, oxidation catalyst 510 is again illustrated in dashed line as optionally deposited and, if deposited, optionally retained after the fin base portion is modified through oxidation. Accordingly, for embodiments where modification comprises an oxidation of the fin base portions, modified base portions 602 have an amorphous microstructure similar to that of isolation dielectric 203. Modified base portions 602 may further have a chemical composition that is readily distinguishable from that of the surrounding isolation dielectric 203, or not.

In alternative embodiments where backside subfin modification comprises impurity counter doping, the majority atom composition, as well as the crystallinity, of modified base portion 602 is readily distinguishable from isolation dielectric 203 (e.g., an amorphous oxide of silicon). Sidewall 204 is then an interface between materials of both different microstructure and different chemical composition. When subfin modification is through impurity doping, the impurity concentration through a thickness of modified base portion 602 may vary as a function of base portion height H, for example as illustrated in FIG. 6B. The acceptor (P-type) impurity within modified base portion 602 reaches a peak of no more than 1e19/cm3 (e.g., 1e18-19/cm3) and tails off to a lower concentration with closer proximity to gate electrode 210. The illustrated profile may follow a typical gaussian-type implant straggler distribution, but is inverted from an impurity concentration profile that would instead result from and implantation entering through the frontside of NMOS transistor structure 310. FIG. 6C illustrates a similar N-type impurity profile within modified base portion 602 of PMOS transistor structure 315.

As further illustrated in FIG. 6B and FIG. 6C, and in accordance with further embodiments, some base portion of source and drain material 206 may be either oxidized or counter-doped during the modification of base portion 602. Although implantation and oxidation process parameters may be predetermined to modify the full height H of base portion 602, a robust base modification may modify to a sum greater height H+Δ from the back surface of base portion 602. A greater modification height H+Δ may ensure an entirety of the fin base portion 602 is modified into a state consistent with low source/drain leakage. Accordingly, the base modification may push interface 607 between modified base portion 602 and source and drain material 206 away from the backside of modified base portion 602, thereby modifying a base portion of source and drain material 206 into an oxidized or counter-doped interface material 606. While interface material 606 is present at an interface of modified base portion 602 within end lengths L_E, gate electrode 210 may serve as a barrier protecting channel portion 205A from any significant modification. As long as the modification height H+Δ does not encroach beyond a sidewall of gate electrode 210, for example leaving a sufficiently large standoff S1 from channel portion 205A nearest to modified base portion 602, interface material 606 should not be detrimental to transistor operation.

For the exemplary PMOS transistor 315 shown in FIG. 2C, interface material 606 also extends to a height H+Δ, but there is a larger standoff S2 between channel portion 205D nearest to modified base portion 602 as a result of the offset in vertical position of channel portions 205D-205F relative to channel portions 205A-205C.

Figure 7:
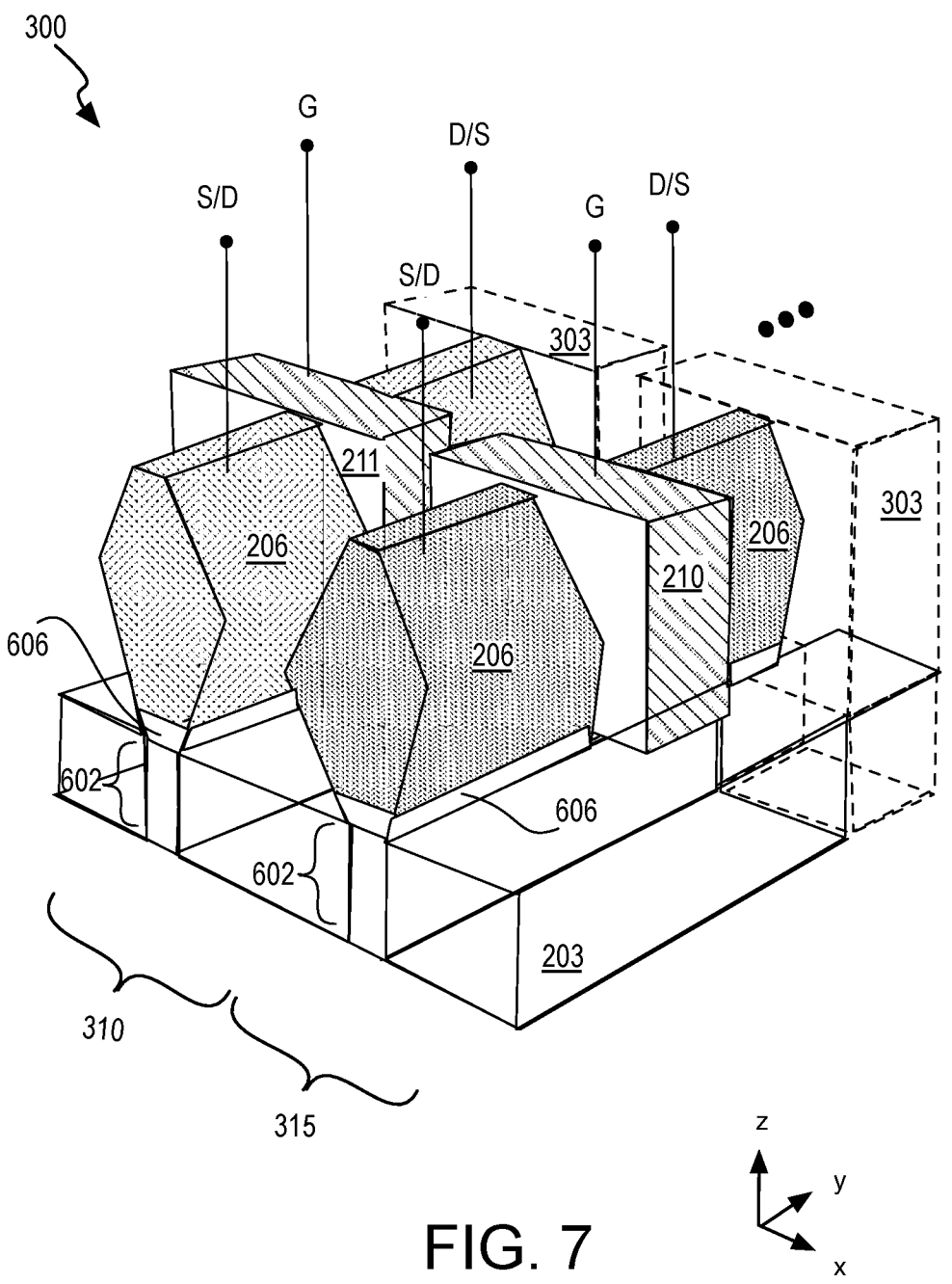
FIG. 7 illustrates an isometric view of the pair of transistor stack structures introduced in FIG. 3 following backside modification of subfin semiconductor, in accordance with some embodiments.

FIG. 7 illustrates an isometric view of IC structure 300 including transistor structures 310 and 315 following fin base portion modification. As shown in FIG. 7, transistor structures 310 and 315 have lower subfin leakage between source and drain regions 206 than they would with an unmodified base portion, for example as introduced in FIG. 3. IC structure 300 may then be processed further according to any known techniques to complete fabrication of an IC.

Figure 8:
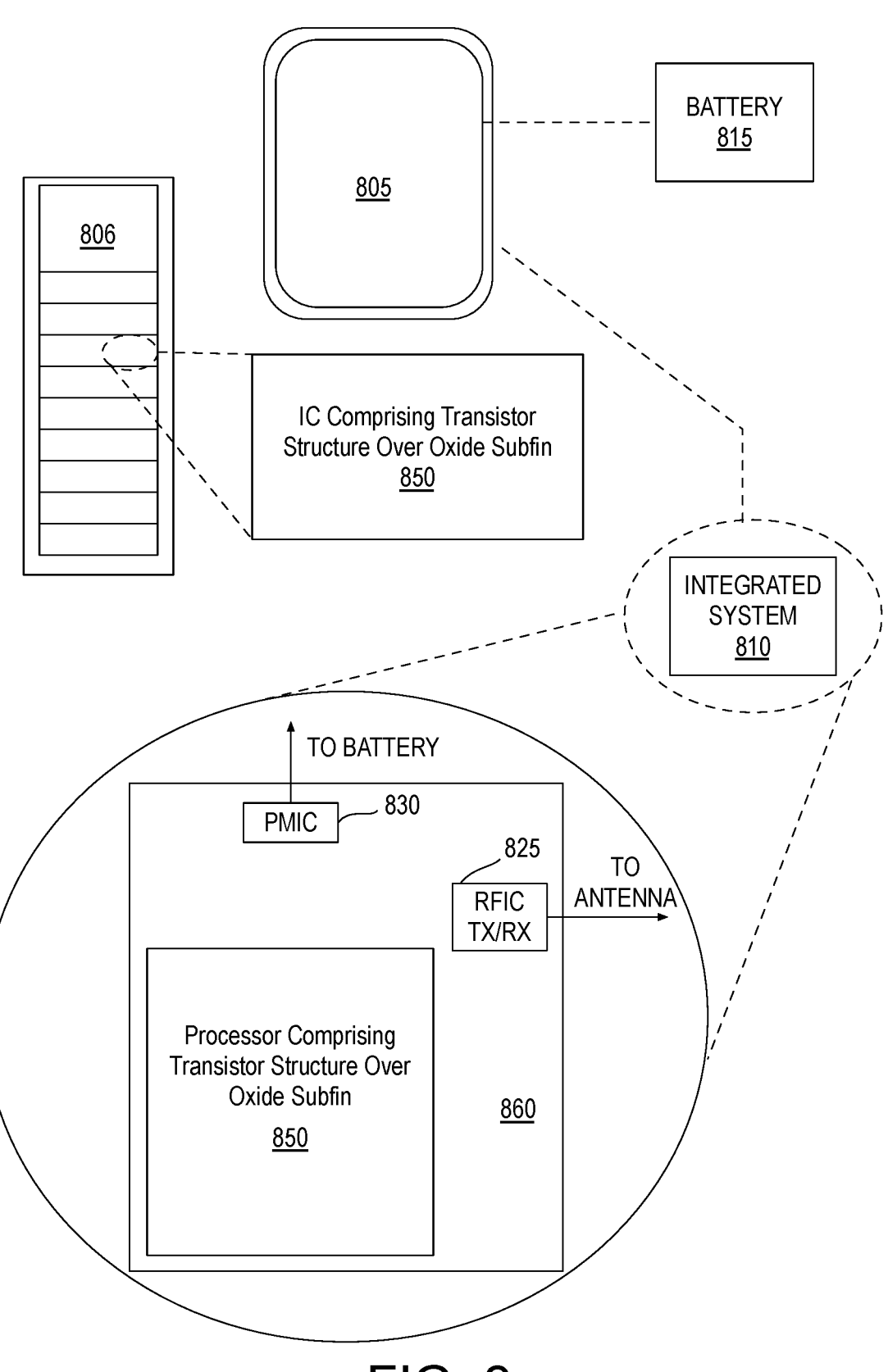
FIG. 8 illustrates a mobile computing platform and a data server machine employing an IC having a transistor structure over a modified, low-leakage subfin, in accordance with embodiments.

The IC structures described above may be integrated into any high-performance IC where ultra-low source/drain (off-state) leakage is advantageous. For example, FIG. 8 illustrates a system in which a mobile computing platform 805 and/or a data server machine 806 employs a CMOS IC including transistor structures having low-leakage subfins or base portions, for example in accordance with embodiments described elsewhere herein. The server machine 806 may be any commercial server, for example including any number of high-performance computing platforms disposed within a rack and networked together for electronic data processing, which in the exemplary embodiment includes a monolithic IC 850. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level integrated system 810, and a battery 815.

Whether disposed within the integrated system 810 illustrated in the expanded view 620, or as a stand-alone packaged chip within the server machine 806, IC 850 may include memory circuitry (e.g., RAM), or a logic circuitry (e.g., a microprocessor, a multi-core microprocessor, graphics processor, or the like), at least one of which further includes transistor structures having low-leakage subfins or base portions, for example in accordance with embodiments describe elsewhere herein. IC 850 may be further coupled to a board, a substrate, or an interposer 860.

Microprocessor may be further coupled to a board, a substrate, or an interposer. One or more of a power management integrated circuit (PMIC) 830, or an RF (wireless) integrated circuit (RFIC) 825 including a wideband RF (wireless) transmitter and/or receiver (TX/RX) may be further coupled to board.

Functionally, PMIC 830 may perform battery power regulation, DC-to-DC conversion, etc., and so has an input coupled to battery 815 and with an output providing a current supply to other functional modules (e.g., microprocessor 850). As further illustrated, in the exemplary embodiment, RFIC 825 has an output coupled to an antenna (not shown) to implement any of a number of wireless standards or protocols, IC 850 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 9:
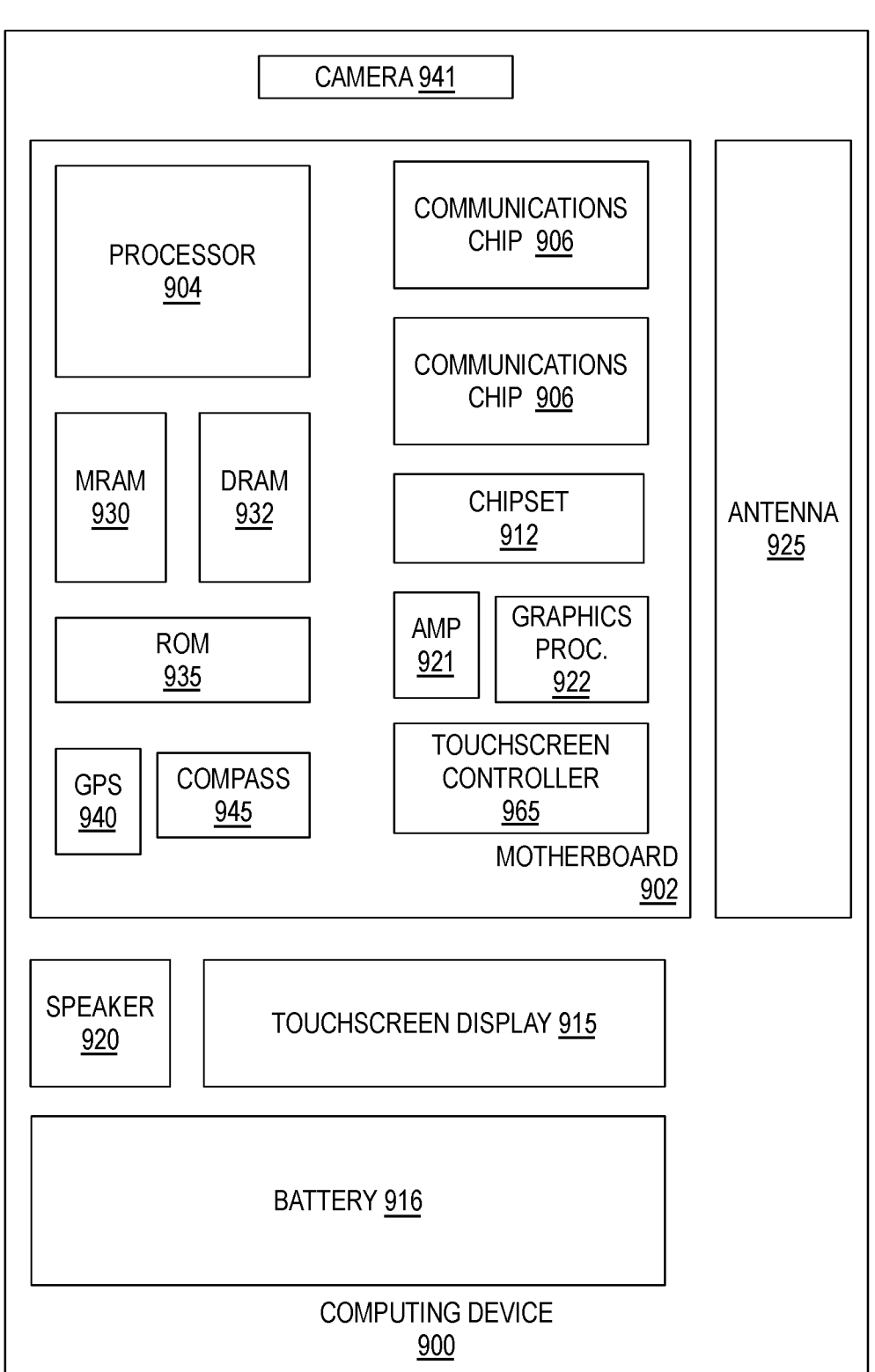
FIG. 9 is a functional block diagram of an electronic computing device, in accordance with some embodiments.

FIG. 9 is a functional block diagram of an electronic computing device 900, in accordance with some embodiments. Device 900 further includes a motherboard 902 hosting a number of components, such as, but not limited to, a processor 904 (e.g., an applications processor). Processor 904 may be physically and/or electrically coupled to motherboard 902. In some examples, processor 904 is part of a monolithic IC structure, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 902. In further implementations, communication chips 906 may be part of processor 904. Depending on its applications, computing device 900 may include other components that may or may not be physically and electrically coupled to motherboard 902. These other components include, but are not limited to, volatile memory (e.g., DRAM 932), non-volatile memory (e.g., ROM 935), flash memory (e.g., NAND or NOR), magnetic memory (MRAM 930), a graphics processor 922, a digital signal processor, a crypto processor, a chipset 912, an antenna 925, touchscreen display 915, touchscreen controller 965, battery 916, audio codec, video codec, power amplifier 921, global positioning system (GPS) device 940, compass 945, accelerometer, gyroscope, speaker 920, camera 941, and mass storage device (such as hard disk drive, solid-state drive (SSD), compact disk (CD), digital versatile disk (DVD), and so forth, or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including, but not limited to, those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

In first examples, an integrated circuit (IC) structure comprises one or more levels of metallization on a frontside of a transistor structure. The transistor structure further comprises a channel portion of a fin, a crystalline source material and a drain material at opposite ends of channel portion, and a gate stack adjacent to the channel portion. The IC structure comprises a base portion of the fin on a backside of the transistor structure. The gate stack is between, and in direct contact with, a center length of the base portion and the channel portion of the fin. A first end length of the base portion is in direct contact with the source material. A second end length of the base portion is in direct contact with the drain material. The base portion is an amorphous material comprising oxygen, and Si or Ge. The IC structure comprises an isolation dielectric adjacent to a sidewall of the base portion.

In second examples, for any of the first examples a metal impurity is in contact with a backside of the base portion, the metal impurity associated with a catalytic oxidation of the Si or Ge within the base portion.

In third examples, for any of the second examples the metal is Al.

In fourth examples, for any of the first through second examples the source material and drain material comprise Si and Ge, the base portion comprises Si and is substantially free of Ge, and the channel portion is under compressive strain associated with lattice mismatch between a lattice constant of monocrystalline Si and a lattice constant associated with the source and drain material.

In fifth examples, for any of the first through fourth examples, within the first end length of the base portion a concentration of an acceptor impurity increases with proximity to an interface with the source material.

In sixth examples, for any of the first through fifth examples the thickness of the first end length is greater than a thickness of the center length, and the interface with the source material is laterally adjacent to a sidewall of the gate stack.

In seventh examples, for any of the first through sixth examples the isolation dielectric has a composition distinct from that of the base portion of the fin.

In eighth examples, an integrated circuit (IC) structure comprises one or more levels of metallization on a frontside of a transistor structure. The transistor structure further comprises a channel portion of a fin, a source material and a drain material at opposite ends of channel portion, wherein the source and drain materials are crystalline, and comprise Si, Ge, and an acceptor impurity, and a gate stack adjacent to the channel portion. The IC structure comprises a base portion of the fin on a backside of the transistor structure. The gate stack is between, and in direct contact with, a center length of the base portion and the channel portion of the fin. A first end length of the base portion is in direct contact with the source material. A second end length of the base portion is in direct contact with the drain material. The base portion is crystalline and comprises Si or Ge, and a donor impurity, and a concentration of the donor impurity within the center length of the base portion declines with proximity to the gate stack. The IC structure comprises dielectric material adjacent to a sidewall of the base portion.

In ninth examples, for any of the eighth examples a peak concentration of the donor impurity within the center length of the base portion is at least an order of magnitude lower than that of the source and drain materials.

In tenth examples, for any of the eighth through ninth examples the peak concentration is $1e17-e19/cm^3$.

In eleventh examples, a computer system comprises a power supply, and an IC die coupled to the power supply. The IC die comprises the IC structure of any of the first through tenth examples.

In twelfth examples, a method of fabricating an integrated circuit structure comprises forming a transistor structure from a fin fabricated on a frontside of a semiconductor crystal, exposing a base portion of the fin from a backside of the transistor structure, and oxidizing the base portion into an amorphous material comprising oxygen, and Si or Ge, or implanting the base portion with an impurity associated with a conductivity type complementary to that of the source material and drain material.

In thirteenth examples, for any of the twelfth examples forming the transistor structure comprises forming a crystalline fin comprising a channel portion over a center length of the base portion, the base portion adjacent to an isolation dielectric, epitaxially growing a source material and a drain material at opposite ends of the channel portion, and upon a first end length and a second end length of the base portion. The method comprises forming a gate stack between, and in direct contact with, the channel portion and the center length of the base portion of the fin, and forming one or more levels of metallization over the frontside of the fin.

In fourteenth examples, for any of the twelfth through thirteenth examples the method comprises oxidizing the base portion by heating the base portion to a temperature of less than 425° C.

In fifteenth examples, for any of the fourteenth examples oxidizing the base portion comprises depositing an oxidation catalyst prior to the heating.

In sixteenth examples, for any of the fifteenth examples the oxidation catalyst comprises a metal.

In seventeenth examples, for any of the sixteenth examples the metal is Al, and the oxidation catalyst comprises $Al_2O_3$.

In eighteenth examples, for any of the fourteenth through seventeenth examples oxidizing the base portion comprises exposing the base portion to an oxygen plasma.

In nineteenth examples, for any of the fourteenth through eighteenth examples oxidizing the base portion comprises oxidizing a portion of the source and drain material in contact with the base portion.

In twentieth examples, for any of the twelfth examples the method comprises implanting the base portion with the impurity to a peak impurity concentration of 1e17-1e19/$cm^3$.

In twenty-first examples, for any of the twelfth through twentieth examples forming the crystalline fin comprises epitaxially growing a crystalline material stack of a plurality of bi-layers from a seeding surface of a substrate, and etching through the crystalline material stack and into a portion of the substrate.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
one or more levels of metallization on a frontside of a transistor structure, wherein the transistor structure further comprises:
a channel portion of a fin;
a source material and a drain material at opposite ends of channel portion, wherein the source and drain materials are crystalline; and
a gate stack adjacent to the channel portion; and
a base portion of the fin on a backside of the transistor structure, wherein:
the gate stack is between, and in direct contact with, a center length of the base portion and the channel portion of the fin;
a first end length of the base portion is in direct contact with the source material;
a second end length of the base portion is in direct contact with the drain material; and
the base portion is an amorphous material comprising oxygen, and Si or Ge and a metal impurity associated with a catalytic oxidation of the Si or Ge within the base portion; and
an isolation dielectric adjacent to a sidewall of the base portion.

2. The IC structure of claim 1, wherein the metal impurity is Al.

3. The IC structure of claim 1, wherein:
the source material and the drain material comprise Si and Ge;
the base portion comprises Si and is substantially free of Ge; and
the channel portion is under compressive strain associated with lattice mismatch between a lattice constant of monocrystalline Si and a lattice constant associated with the source and drain material.

4. The IC structure of claim 1, wherein the isolation dielectric has a composition distinct from that of the base portion of the fin.

5. An integrated circuit (IC) structure, comprising:
one or more levels of metallization on a frontside of a transistor structure, wherein the transistor structure further comprises:
a channel portion of a fin;
a source material and a drain material at opposite ends of channel portion, wherein the source and drain materials are crystalline, and comprise Si, and a donor impurity; and
a gate stack adjacent to the channel portion; and
a base portion of the fin on a backside of the transistor structure, wherein:
the gate stack is between, and in direct contact with, a center length of the base portion and the channel portion of the fin;
a first end length of the base portion is in direct contact with the source material;
a second end length of the base portion is in direct contact with the drain material; and
the base portion comprises oxygen, Al, and Si or Ge; and
a dielectric material adjacent to a sidewall of the base portion.

6. A computer system, comprising:
a power supply; and
an IC die coupled to the power supply, wherein the IC die comprises the IC structure of claim 1.

* * * * *